United States Patent [19]

Sugiura et al.

[11] Patent Number: 5,327,395
[45] Date of Patent: Jul. 5, 1994

[54] PAGE-MODE TYPE MEMORY WRITING CONTROL CIRCUIT USING END-OF-PAGE ADDRESS

[75] Inventors: Yoshihisa Sugiura, Sagamihara; Yoshihisa Iwata; Masaki Momodomi, both of Yokohama; Yasuo Itoh, Kawasaki; Tomoharu Tanaka, Yokohama; Yoshiyuki Tanaka, Tokyo, all of Japan

[73] Assignee: Kabushiki Kaisha Toshiba, Kawasaki, Japan

[21] Appl. No.: 957,000

[22] Filed: Oct. 6, 1992

[30] Foreign Application Priority Data

Oct. 7, 1991 [JP] Japan ................... 3-259471

[51] Int. Cl.$^5$ ............................................. G11C 8/00
[52] U.S. Cl. ............................ 365/238.5; 365/230.08
[58] Field of Search ........... 365/238.5, 230.05, 189.08, 365/219, 240, 230.08; 395/164, 166, 425; 340/799

[56] References Cited

U.S. PATENT DOCUMENTS

| 4,378,594 | 3/1983 | Kenyon | 395/425 |
| 4,636,986 | 1/1987 | Pinkham | 365/240 |
| 4,644,494 | 2/1987 | Muller | 395/425 |
| 4,686,650 | 8/1987 | Hori et al. | 365/219 |
| 4,870,622 | 9/1989 | Aria et al. | 365/238.5 |
| 4,961,171 | 10/1990 | Pinkham et al. | 365/230.05 |

OTHER PUBLICATIONS

"64-bit EEPROM Speeds In-System Reprogramming, Adds Data Polling", Electronic Design, Aug. 23, 1984, pp. 197-204.
Toshiba Corporation, "4M bit CMOS NAND E$^2$-PROM TC584000P/F/FT/TR Target Specification," FT-001A Sep., 1991.

Primary Examiner—Eugene R. LaRoche
Assistant Examiner—Son Dinh
Attorney, Agent, or Firm—Banner, Birch, McKie & Beckett

[57] ABSTRACT

A NOR operation is performed on the address bit by bit by a NOR circuit, and when the final address in a page is detected from the result of the NOR operation by a final address detection circuit, a program starting circuit executes data writing to a memory cell. This can ensure detection of the final address in a page without using a counter circuit. It is therefore possible to simplify the structure of the final address detection circuit and reduce the circuit area occupying in a semiconductor memory device.

5 Claims, 6 Drawing Sheets

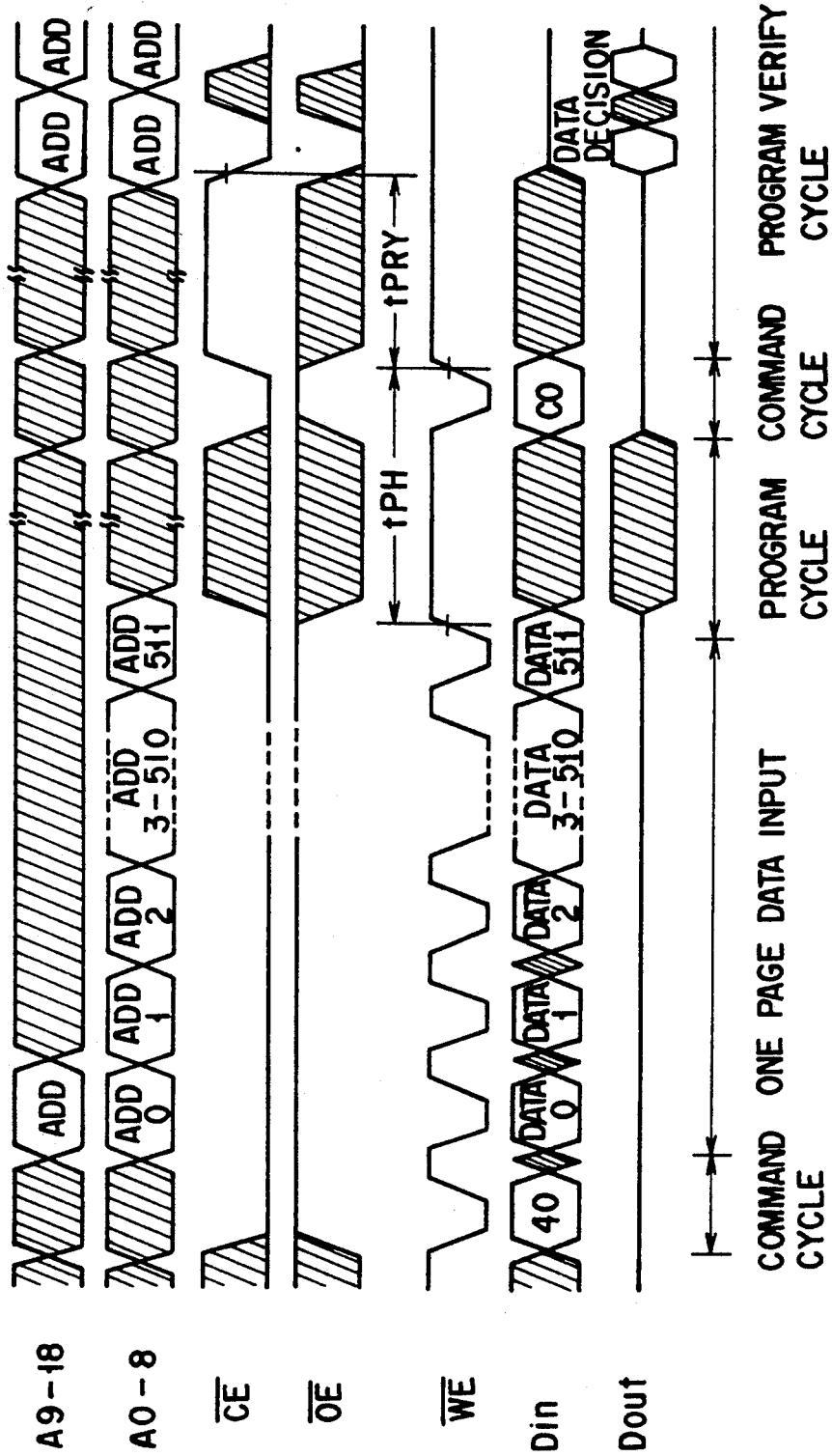
F I G. 1

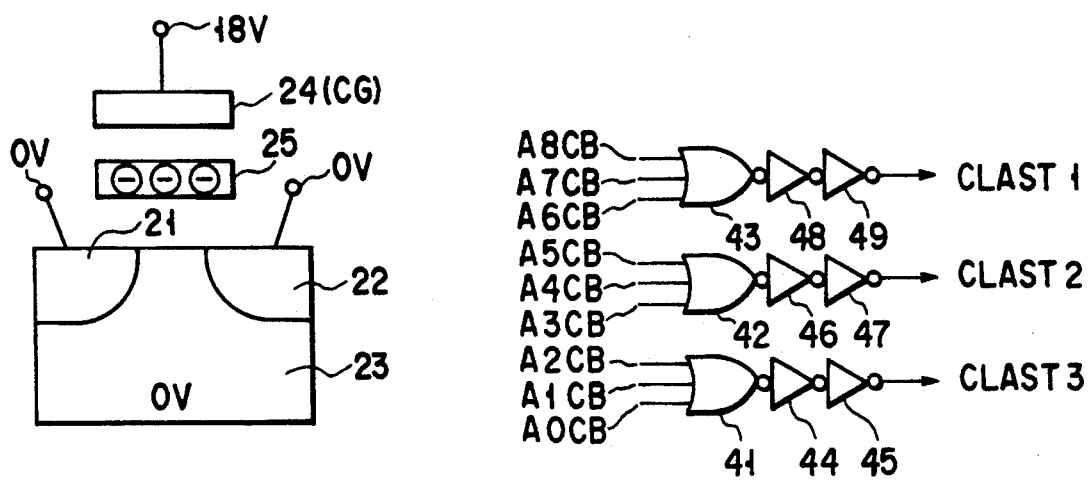
F I G. 2
F I G. 4
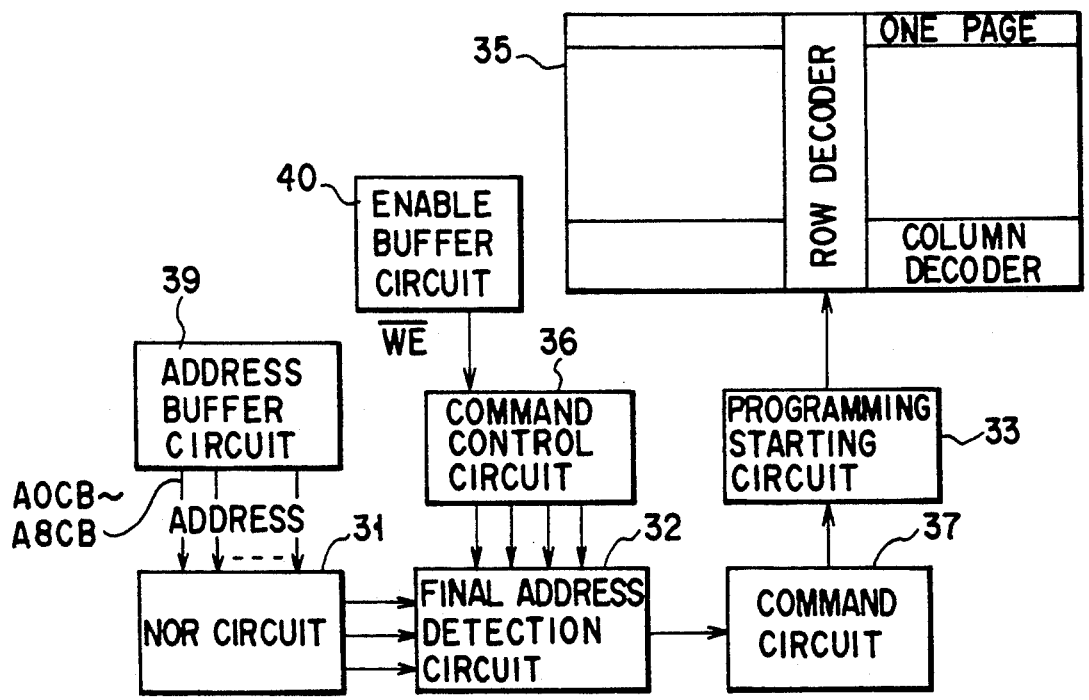
F I G. 3

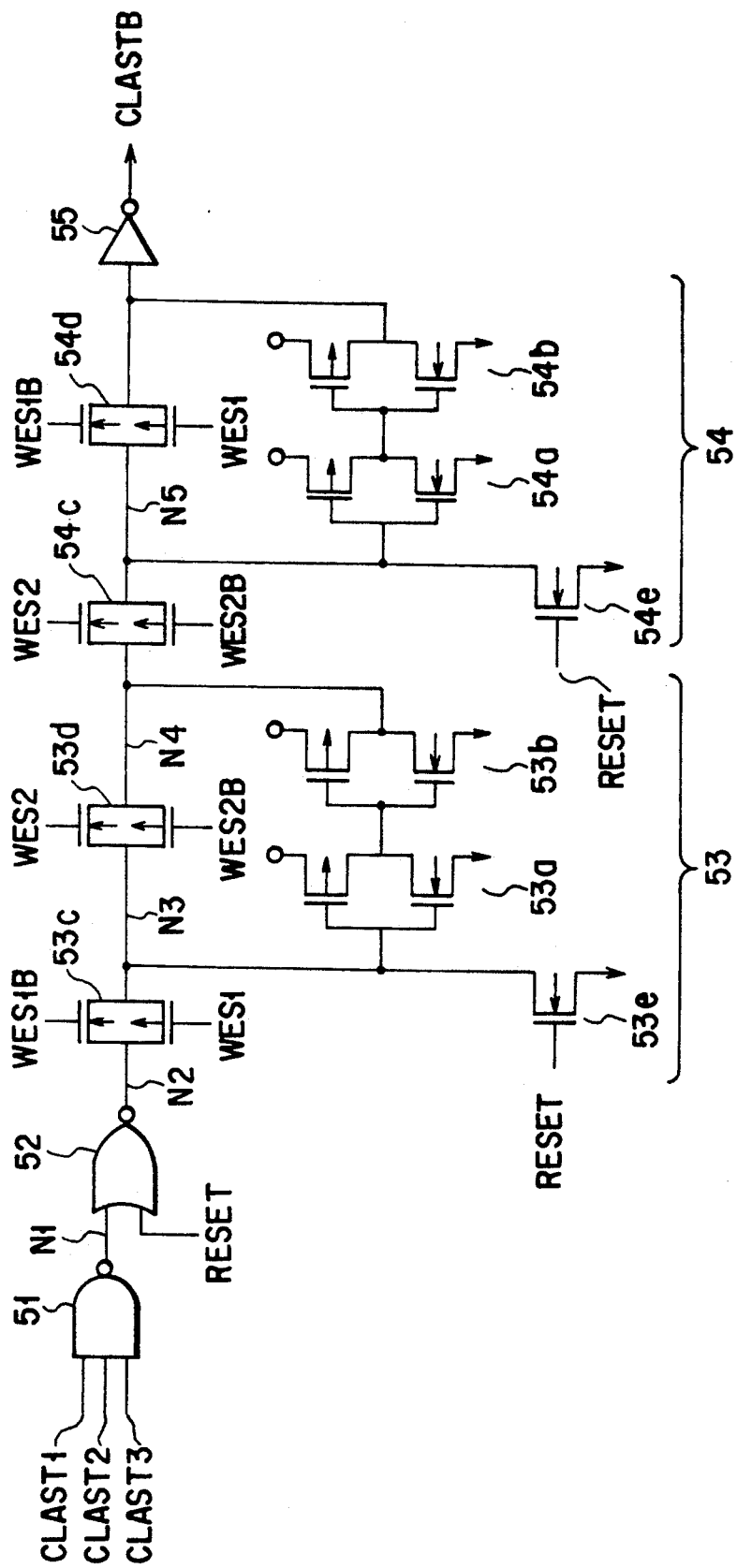
F I G. 5

PAGE-MODE TYPE MEMORY WRITING CONTROL CIRCUIT USING END-OF-PAGE ADDRESS

BACKGROUND OF THE INVENTION

1. Field of the Invention

The present invention relates to a semiconductor memory device, for example, NAND type EEPROM (Electrically Erasable and Programmable ROM).

2. Description of the Related Art

In this type of NAND EEPROM, data is basically written page by page. Since the page-by-page writing is done in such a way that programming is effected after all of one page of data is input to a latch circuit, the data input cycle should be discriminated from the program cycle. It is thus necessary to acknowledge the completion of input of the entire one page of data.

The end of the data input cycle is conventionally detected by counting the number of pieces of input data using a counter circuit.

Counter circuits conventionally used each occupy a large area in a semiconductor memory device and have a complicated structure.

SUMMARY OF THE INVENTION

It is therefore an object of the present invention to provide a semiconductor memory device which detects the final address in a page with a simple circuit occupying a smaller circuit area to be able to execute the next programming operation.

To achieve the foregoing object, a semiconductor memory device according to this invention comprises a non-volatile semiconductor memory element writable page by page, a detection circuit for detecting a final address in a page, and a write circuit for writing data into the non-volatile semiconductor memory element in accordance with an output signal of the detection circuit.

The detection circuit includes a plurality of NOR circuits for performing an NOR operation on an address bits by bits, and a NAND circuit for performing a NAND operation on an output signal of the NOR circuits.

According to this invention, when the detection circuit detects the final address in a page, the writing circuit writes data into the non-volatile semiconductor memory element. This structure ensures the detection of the final address in a page without using any counter circuit. It is thus possible to construct a final address detection circuit with a simple circuit and reduce the area of the circuit occupying in the semiconductor memory device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a timing chart illustrating a page writing cycle of an EEPROM;

FIG. 2 is a diagram showing potentials applied when data of "0" is written in a memory cell;

FIG. 3 is a structural diagram illustrating one embodiment of the present invention;

FIG. 4 is a specific circuit diagram showing a NOR circuit shown in FIG. 3;

FIG. 5 is a specific circuit diagram showing a final address detection circuit shown in FIG. 3;

DETAILED DESCRIPTION OF THE PREFERRED EMBODIMENT

Figure 6:
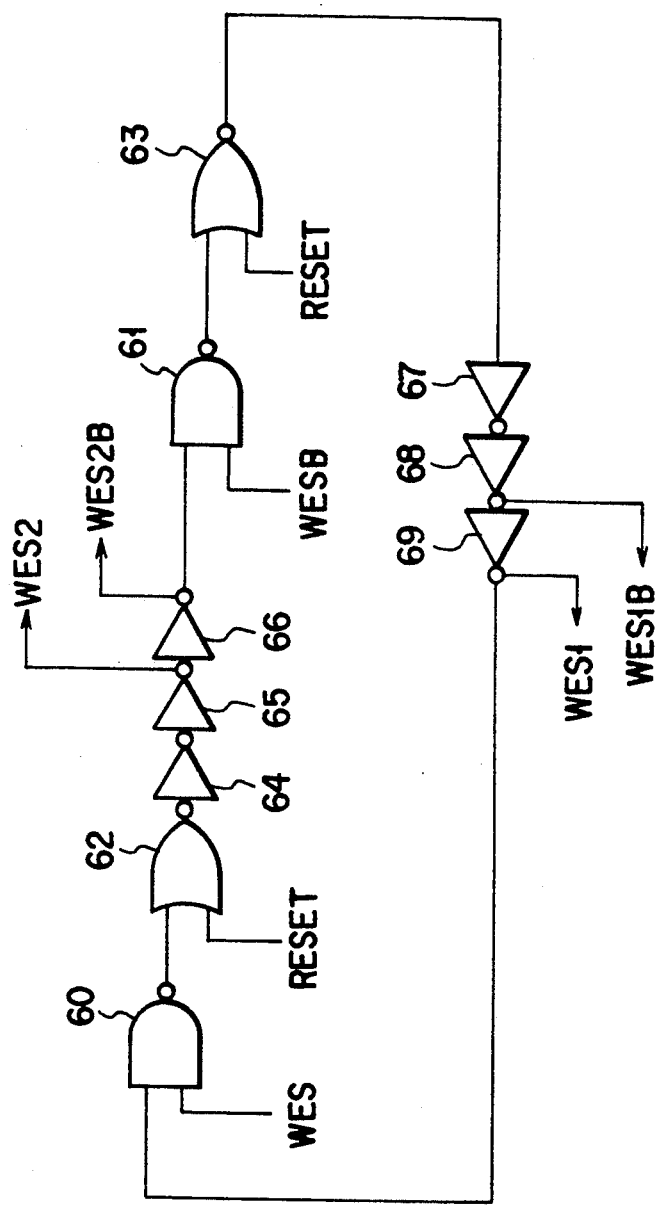
FIG. 6 is a specific circuit diagram showing a command control circuit shown in FIG. 3.

One preferred embodiment of the present invention will now be described referring to the accompanying drawings.

FIG. 1 illustrates a page writing cycle of an EEPROM.

The page writing cycle includes a command cycle, a data input cycle and a program cycle. In the command cycle a command for specifying the beginning of writing is fetched in response to single toggling of a WE (Write Enable) signal. By the next toggling of the WE signal, the data input cycle starts and input data is held as write data into a latch circuit connected to each bit line. When one page of data is all latched, the page writing cycle enters the program cycle to start running a program. The program cycle is a cycle with a relatively long period of execution as indicated by "t PH" in the diagram. In FIG. 1, after the program cycle comes a program verify cycle to verify the written data.

FIG. 2 illustrates potentials applied to a source 21, drain 22, well 23 and control gate 24 of a memory cell when data of "0" is written in that memory cell. With the potentials of the source 21, drain 22 and well 23 of the memory cell 20 set to 0 V and the potential of the control gate 24 set to Vpp (=18 V), electrons are injected to the floating gate 25 by an F-N (Fowler-Nordheim) tunnel current.

FIG. 3 presents general circuit blocks according to one embodiment of the present invention. Individual address signals indicating an address in a page are supplied from an address buffer 39 to a NOR circuit 31 where they are NORed. The result of this operation is supplied as a final address detection signal to a final address detection circuit 32. This detection circuit 32 does not function in the data input cycle; it generates a signal only when the final address of a page is input. The output signal from the detection circuit 32 is supplied via a command circuit 37 to a program starting circuit 33. Upon reception of the output signal and after the rising of the WE signal, the program starting circuit 33 enables a row decoder 34 and a column decoder 38, both connected to a memory cell array 35, starting a program. Connected to the final address detection circuit 32 is a command control circuit 36 which controls the operation of this circuit 32. Address buffer 39 outputs address signals A0CB to A8CB, while an enable buffer 40 outputs the write enable signal WE.

The command circuit 37 and program starting circuit 33 constitute a writing circuit that writes data into the semiconductor memory device 35.

FIG. 4 specifically illustrates the NOR circuit 31.

Referring to FIG. 4, "A0CB-A8CB" are inverted column address signals in a page column address. Those address signals A0CB-A8CB are supplied, three each, to 3-input NOR circuits 41, 42 and 43. Inverters 44, 45, 46, 47, 48 and 49 are connected, two each, to the output terminals of the NOR circuits 41, 42 and 43. For instance, when the address signals A0, A1 and A2 are at a high level, their inverted address signals A0CB, A1CB and A2CB become a low level, setting the output of the NOR circuit 41 to a high level. Eventually, a high-level final address detection signal CLAST3 will be output from the output terminal of the inverter 45. The same is true of the inverted address signals A3CB to A8CB. When the inverted address signals A3CB, A4CB and A5CB are at a low level, a high-level final address detection signal CLAST2 will be output from the output terminal of the inverter 47; and when the inverted address signals A6CB, A7CB and A8CB are at a low level, a high-level final address detection signal CLAST1 will be output from the output terminal of the inverter 49.

As an input consists of 512 bytes in this embodiment, the number of address lines is set to nine. Even if the number of input addresses or the page length changes, a similar circuit can be used. The final address detection signals CLAST1, CLAST2 and CLAST3 do not become a high level unless the final address is input or all the column page addresses are a high level.

FIG. 5 illustrates the final address detection circuit 32.

This detection circuit 32 comprises a 3-input NAND circuit 51, a NOR circuit 52, two latch circuits 53 and 54, and inverter 55. Each of the latch circuits 53 or 54 includes two inverters 53a and 53b (54a and 54b), two transfer gates 53c and 53d (54c and 54d), and an N channel MOSFET 53e (54e).

The final address detection signals CLAST1, CLAST2 and CLAST3 are supplied to the NAND circuit 51. The output signal of the NAND circuit 51 is supplied to one input terminal of the NOR circuit 52. The other input terminal of the data NOR circuit 52 and the gates of the N channel MOSFETs 53e and 54e are supplied with a RESET signal. The transfer gates 53c and 54d are respectively supplied with a command control signal WES1 and an inverted command control signal WES1B, while the transfer gates 53d and 54c are respectively supplied with a command control signal WES2 and an inverted command control signal WES2B.

FIG. 6 illustrates the command control circuit 36. This control circuit 36, which generates the mentioned command control signals WES1, WES1B, WES2 and WES2B, comprises NAND circuits 60 and 61, NOR circuits 62 and 63, and inverters 64 to 69, for example. The command control circuit 36 generates the command control signals WES1, WES1B, WES2 and WES2B shown in FIG. 8 in response to the toggling of the WE signal (WES).

Figure 8:
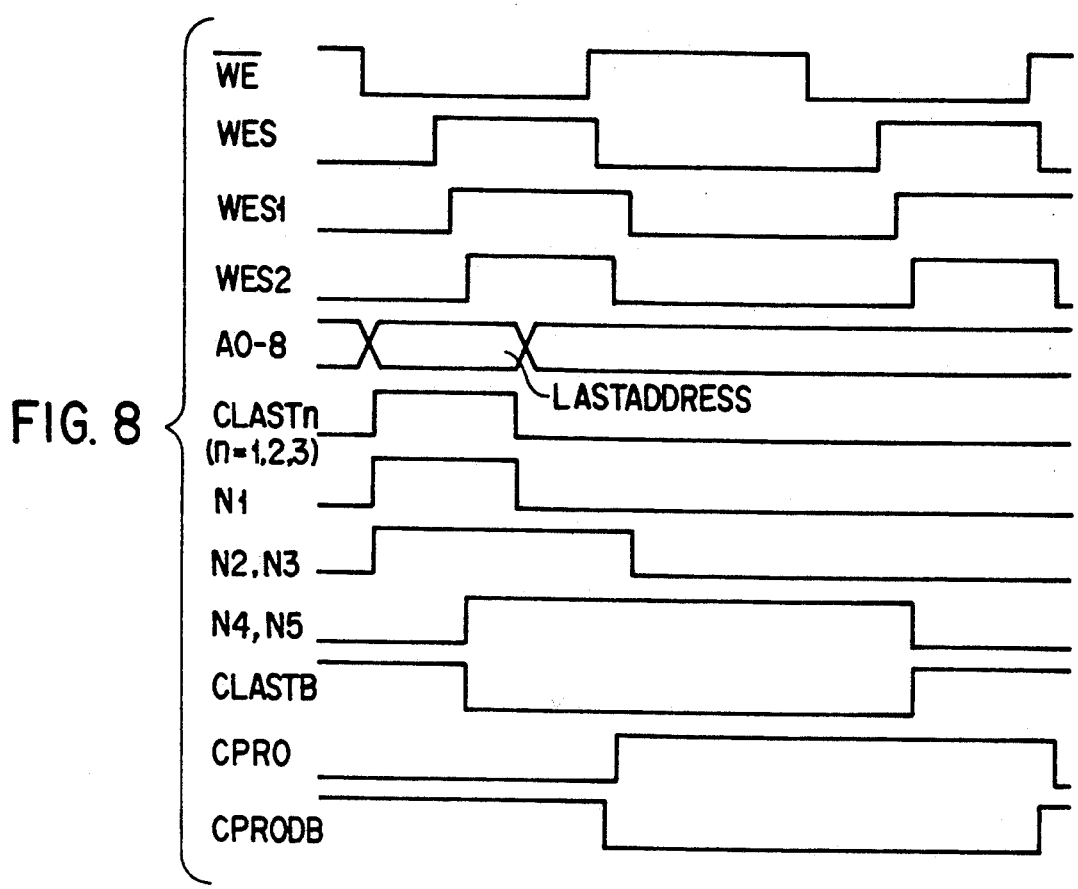
FIG. 8 presents a timing chart illustrating the circuits shown in FIGS. 4 to 7.

In FIG. 5, when the final address detection signals CLAST1, CLAST2 and CLAST3 are all at a high level, a low-level signal is output from the output terminal of the NAND circuit 51. This low-level signal is transferred in order to the latch circuits 53 and 54 in accordance with the cycles of the command control signals WES1, WES1B, WES2 and WES2B, and a CLASTB signal indicating that the final address has been input is output from the output terminal of the inverter 55. This CLASTB signal is input to the command circuit 37. Signals at individual notes N1 to N5 of the final address detection circuit 32 are shown in FIG. 8.

Figure 7:
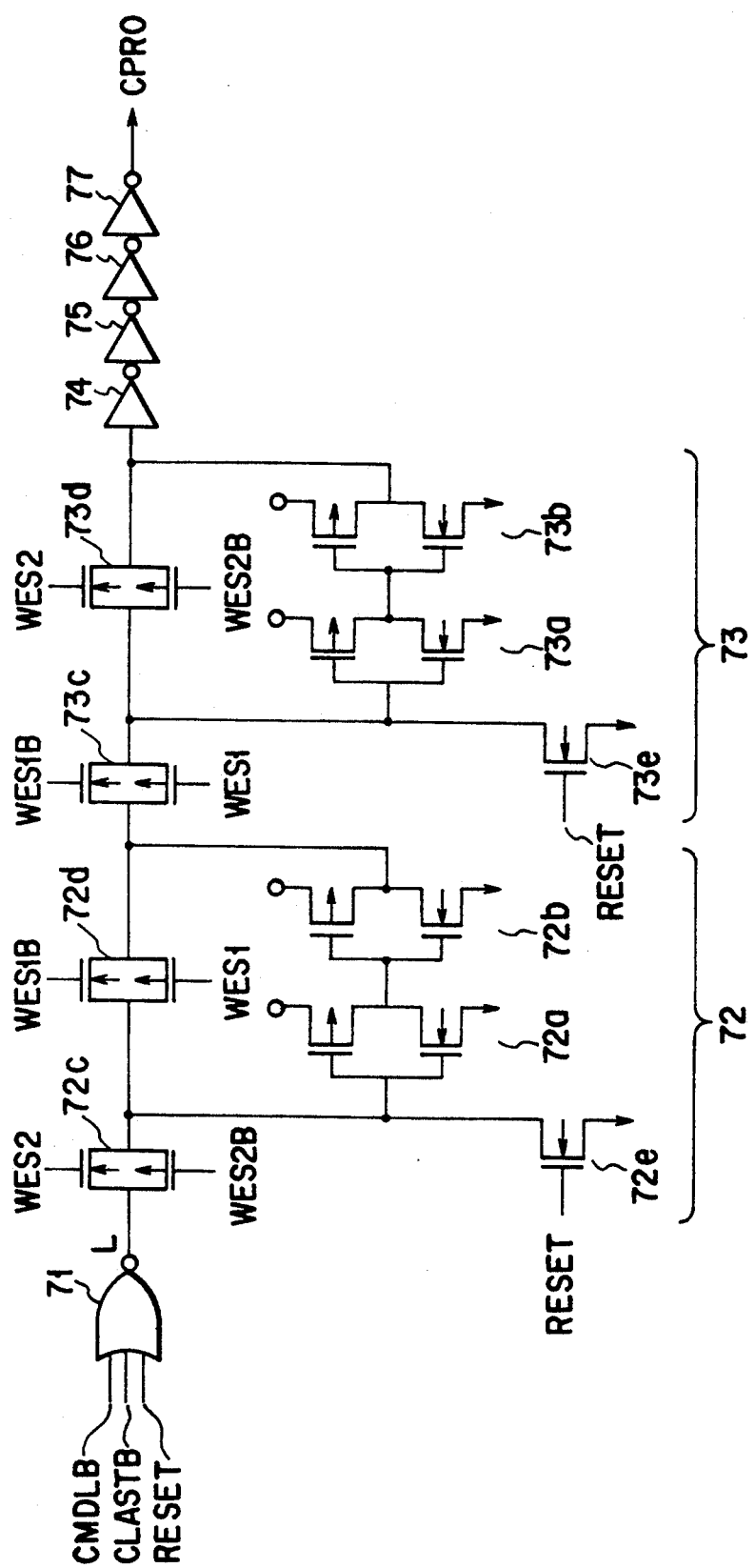
FIG. 7 is a specific circuit diagram showing a command circuit shown in FIG. 3.

FIG. 7 illustrates the command circuit 37.

The command circuit 37 comprises an 3-input NOR circuit 71, two latch circuits 72 and 73, and inverters 74 to 77. Each of the latch circuits 72 or 74 includes two inverters 72a and 72b (73a and 73b), two transfer gates 72c and 72d (73c and 73d), and an N channel MOSFET 72e (73e).

The CLASTB signal is supplied together with a program mode signal CMDLB and the RESET signal to the NOR circuit 71. The output signal of this NOR circuit 71 is supplied to the latch circuit 72. The program mode signal CMDLB is acquired by decoding a signal given from a Din pin. The signal CMDLB indicates that a write command fetched in the command cycle is accepted, which means that the memory cell is in data input mode. The transfer gates 72c and 73d are respectively supplied with the command control signal WES2 and the inverted command control signal WES2B, while the transfer gates 72d and 73c are respectively supplied with the command control signal WES1 and the inverted command control signal WES1B. The gates of the N channel MOSFETs 72e and 73e are supplied with the RESET signal.

When the CLASTB signal is supplied to the NOR circuit 71, this signal is transferred to the latch circuits 72 and 73 and the inverters 74 to 77 in order, and is output as a CRPO from the output terminal of the inverter 77.

Upon reception of the CRPO signal, the program starting circuit 33 applies a potential necessary for a program to the control gate of the memory cell. In writing data, the potential applied to the control gate is Vpp.

Figure 9:
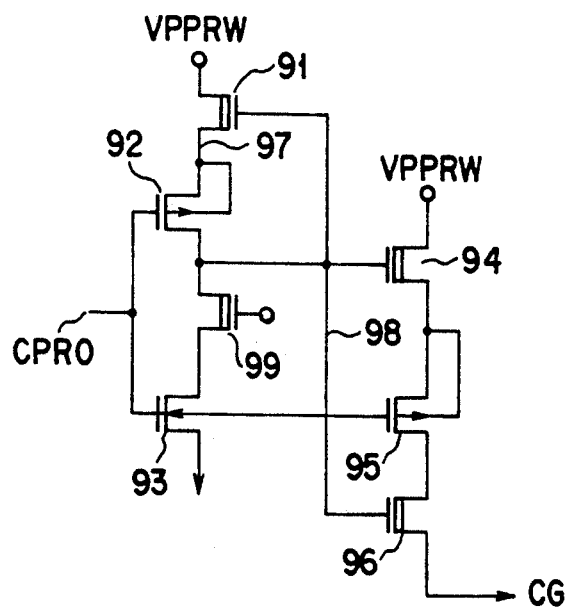
FIG. 9 is a specific circuit diagram showing a program starting circuit shown in FIG. 3.

FIG. 9 illustrates the program starting circuit 33.

In the program starting circuit 33 that applies the potential Vpp, the CRPO signal is connected to the gates of a P channel MOSFET 923 and an N channel MOSFET 93. The MOSFET 92 has its source and back gate connected via a depletion type N channel MOSFET 91 to a power supply VppRW. The drain of the MOSFET 92 is connected via a depletion type N channel MOSFET 99 to the drain of the MOSFET 93. The source of the MOSFET is grounded. The drain of the MOSFET 92 is connected to the gates of depletion type N channel MOSFETs 94 and 96 as well as to the gate of the N channel MOSFET 91. The MOSFET 94 has a drain connected to the power supply VppRW, and its source is connected to the source and back gate of a P channel MOSFET 95. The MOSFET 95 has a gate connected to the gate of the N channel MOSFET 93, and a drain connected to the drain of the depletion type N channel MOSFET 96. The source of this MOSFET 96 is connected to the control gate CG of the memory cell (not shown).

When the CPRO signal corresponding to the final address detection signals is supplied to the program starting circuit 33 having the above structure, the MOSFETs 92 and 95 are turned on and the MOSFET 93 is turned off. Until the MOSFET 92 is turned on, the potential of a node 98 is 0 V and the MOSFET 91 sends a potential for the threshold value to a node 97. Thereafter, through this loop, the potential of the node 98 is raised to the power supply potential Vpp. Consequently, the MOSFETs 94 and 96 are turned on, applying the potential Vpp to the control gate CG of the memory cell.

According to this embodiment, a plurality of NOR circuits perform a NOR operation on the address bits by bits, and send their output signals CLSST1, CLAST2 and CLAST3 to the NAND circuit 51 of the final address detection circuit 32, thereby producing the signal CLASTB that indicates the final address. Since this design, unlike the prior art, eliminates the need for a complex and large counter circuit, it is possible to simplify the structure of the final address detection circuit and reduce the circuit area occupying in the semiconductor memory device.

The present invention is not limited to this embodiment, but may be modified in various manners within the scope and spirit of the invention.

As described above, the present invention can provide a semiconductor memory device which detects the final address in a page with a simple circuit occupying a smaller circuit area to be able to execute the next programing operation.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device comprising:
   a non-volatile semiconductor memory device writable page by page;
   a logic circuit applied with address signals for detecting a final address in a page and generating a final address signal when said final address has been detected; and
   a write circuit responsive to said logic circuit for writing data into said non-volatile semiconductor memory device in accordance with whether said final address signal has been generated.

2. A semiconductor memory device comprising:
   a non-volatile semiconductor memory device writable page by page;
   a NOR circuit for performing a NOR operation on a page address signal from an address buffer and generating a final address detection signal;
   a final address detection circuit for receiving said final address detection signal from said NOR circuit, detecting said final address in a page, and generating an output signal; and
   a write circuit for writing data into said non-volatile semiconductor memory device in accordance with said output signal of said final address detection circuit.

3. The semiconductor memory device according to claim 2, wherein said detection circuit includes a plurality of NOR circuits for performing a NOR operation on an address bit by bit, and a NAND circuit for performing a NAND operation on an output signal of said NOR circuits.

4. The semiconductor memory device according to claim 1, wherein said data include page data supplied to said semiconductor memory device and sequentially latched into a latch circuit.

5. The semiconductor memory device according to claim 2, wherein said data include page data supplied to said semiconductor memory device and sequentially latched into a latch circuit.

* * * * *